United States Patent
Desai et al.

(10) Patent No.: US 7,253,502 B2
(45) Date of Patent: Aug. 7, 2007

(54) CIRCUITIZED SUBSTRATE WITH INTERNAL ORGANIC MEMORY DEVICE, ELECTRICAL ASSEMBLY UTILIZING SAME, AND INFORMATION HANDLING SYSTEM UTILIZING SAME

(75) Inventors: Subahu D. Desai, Vestal, NY (US); How T. Lin, Vestal, NY (US); John M. Lauffer, Waverly, NY (US); Voya R. Markovich, Endwell, NY (US); David L. Thomas, Endicott, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 248 days.

(21) Appl. No.: 10/900,385

(22) Filed: Jul. 28, 2004

(65) Prior Publication Data

US 2006/0022303 A1    Feb. 2, 2006

(51) Int. Cl.
*H01L 23/58* (2006.01)
(52) U.S. Cl. ............ 257/642; 257/759; 257/E23.007
(58) Field of Classification Search ........ 257/295–296, 257/300, 690, 759–760, 777–778, E23.007, 257/642, 758
See application file for complete search history.

(56) References Cited

U.S. PATENT DOCUMENTS

| | | |
|---|---|---|
| 4,956,694 A | 9/1990 | Eide |
| 5,016,085 A | 5/1991 | Hubbard et al. |
| 5,099,309 A | 3/1992 | Kryzaniwsky |
| 5,272,359 A | 12/1993 | Nagasubramanian et al. |
| 5,280,192 A | 1/1994 | Kryzaniwsky |
| 5,426,263 A | 6/1995 | Potter et al. |
| 5,831,833 A | 11/1998 | Shirakawa et al. |
| 6,084,306 A | 7/2000 | Yew et al. |
| 6,242,282 B1 | 6/2001 | Fillion et al. |
| 6,359,235 B1 | 3/2002 | Hayashi |
| 6,388,204 B1 | 5/2002 | Lauffer et al. |
| 6,479,093 B2 | 11/2002 | Lauffer et al. |
| 6,704,207 B2 | 3/2004 | Kopf |
| 6,734,478 B2 | 5/2004 | Johansson et al. |
| 2002/0031005 A1 | 3/2002 | Natori et al. |
| 2002/0184568 A1* | 12/2002 | Kurrasch ................. 714/39 |
| 2003/0015740 A1* | 1/2003 | Li et al. ................. 257/295 |
| 2003/0230746 A1 | 12/2003 | Stasiak |

FOREIGN PATENT DOCUMENTS

JP    2002026277    1/2002

* cited by examiner

*Primary Examiner*—Thanhha S. Pham
(74) *Attorney, Agent, or Firm*—Hinman, Howard & Kattell, LLP; Lawrence R. Fraley

(57) ABSTRACT

A circuitized substrate comprised of at least one dielectric material having an electrically conductive pattern thereon. At least part of the pattern is used as the first layer of an organic memory device which further includes at least a second dielectric layer over the pattern and a second pattern aligned with respect to the lower part for achieving several points of contact to thus form the device. The substrate is preferably combined with other dielectric-circuit layered assemblies to form a multilayered substrate on which can be positioned discrete electronic components (e.g., a logic chip) coupled to the internal memory device to work in combination therewith. An electrical assembly capable of using the substrate is also provided, as is an information handling system adapted for using one or more such electrical assemblies as part thereof.

22 Claims, 5 Drawing Sheets

CIRCUITIZED SUBSTRATE WITH INTERNAL ORGANIC MEMORY DEVICE, ELECTRICAL ASSEMBLY UTILIZING SAME, AND INFORMATION HANDLING SYSTEM UTILIZING SAME

TECHNICAL FIELD

The present invention relates to circuitized substrates, and more particularly to composite circuitized structures such as printed circuit boards (PCBs), chip carriers, and the like. The present invention also relates to methods for fabricating such structures, electrical assemblies (e.g., PCB-chip carrier assemblies) utilizing same, and to information handling systems (e.g., computers, servers, etc.) utilizing such substrates and/or assemblies.

BACKGROUND OF THE INVENTION

One known method of forming a laminate circuitized substrate (e.g., PCB) structure includes forming layers of dielectric material and electrically conducting material to provide multiple layers of circuits and voltage planes. Circuits can be discrete wiring patterns known as signal planes. Voltage planes can be either ground plane or power planes, and are sometimes collectively referred to as power planes. In one technique of forming such structures, layers of dielectric material and conductive material are successively applied, e.g., the dielectric material is applied and then circuits or voltage planes are provided thereon and, typically, thru-holes (described in greater detail hereinbelow) are formed, typically by drilling or etching. This method relies on each successive step of adding additional structure and the circuitry layers are formed individually, e.g., in each step in forming the plane having circuit traces or formed power planes. This requires precision drilling to form the plated thru-holes (PTHs) all of which is time consuming, especially where there are a large number of drilled holes required to form PTHs.

More recently, methods have been described that provide a relatively inexpensive photolithographic technique of forming a composite laminate structure (substrate assembly) from individual discrete laminate structures (substrates). For example, see U.S. application Ser. No. 09/812,261, entitled "Printed Wiring Board Structure With Z-Axis Interconnections" and filed Mar. 19, 2001. See also U.S. Pat. No. 6,388,204 (Lauffer et al) and U.S. Pat. No. 6,479,093 (Lauffer et al), the teachings of which are incorporated herein by reference.

In double-sided and multilayer PCBs, it is necessary to provide the aforementioned thru-holes between the various conductive layers or sides of the board. This is commonly achieved by providing metallized, conductive thru-holes in the board which communicate with the sides and layers requiring electrical interconnection. For some applications, it is desired that electrical connection be made with almost if not all of the conductive layers. In such a case, thru-holes are also typically provided through the entire thickness of the board. For these, as well as other applications, it is often desired to also provide electrical connection between the circuitry on one face of the board and one or more of the inner circuit layers. In those cases, "blind vias", passing only part way through the board are provided. In still another case, such multilayered boards often require internal "vias" which are located entirely within the board's structure and covered by external layering, including both dielectric and conductive. Such internal "vias" are typically formed within a sub-part structure of the final board and then combined with other layers during final lamination of the board. For purposes of this application, therefore, the term "thru-hole" is meant to include such conductive openings that pass entirely through the board (plated through holes or PTHs), "blind vias" which extend from an external surface of the board into a specified conductive layer of the board, as well as "internal vias" which is internally "captured" by the board's outer layers.

Complexity of circuitized substrates such as PCBs has increased significantly over the past few years, due primarily to increased operational requirements for the products in which these substrates are utilized. For example, boards for mainframe computers may have as many as thirty-six layers of circuitry or more, with the complete stack having a thickness of about 0.250 inch (or 250 mils). These boards are typically designed with three or five mil wide signal lines and twelve mil diameter thru-holes. For increased densification in many of today's PCBs, the industry seeks to reduce signal lines to a width of two mils or less and thru-holes to a diameter of two mils or less. As will be defined herein in greater detail, a primary feature of the instant invention is the provision of a circuitized substrate possessing much greater operational capabilities than such substrates and electrical assemblies utilizing same known in the art. A specific feature of the invention is the inclusion of one or more organic memory "devices" within the substrate itself, thereby eliminating the need for externally mounted components of this type and saving more surface space for components such as semiconductor logic chips and the like to even further increase the final product's operational capabilities.

In U.S. Pat. No. 6,704,207, entitled "Device and Method for Interstitial Components in a Printed Circuit Board", issued Mar. 9, 2004, there is described a printed circuit board (PCB) which includes a first layer having first and second surfaces, with an above-board device (e.g., an ASIC chip) mounted thereon. The PCB includes a second layer having third and fourth surfaces. One of the surfaces can include a recessed portion for securedly holding an interstitial component. A "via", electrically connecting the PCB layers, is also coupled to a lead of the interstitial component. The described interstitial components include components such as diodes, transistors, resistors, capacitors, thermocouples, and the like. In what appears to be the preferred embodiment, the interstitial component is a resistor having a similar size to a "0402" resistor (manufactured by Rohm Co.), which has a thickness of about 0.014 inches.

In U.S. Pat. No. 6,242,282, entitled "Circuit Chip Package and Fabrication Method", issued Jun. 5, 2001, there is described a method for packaging a chip which includes the steps of providing an interconnect layer including insulative material having a first side and a second side, initial metallization patterned on second side metallized portions of the second side and not on second side non-metallized portions of the second side, a substrate via extending from the first side to one of the second side metallized portions, and a chip via extending from the first side to the second side non-metallized portion. The method also includes positioning a chip on the second side with a chip pad of the chip being aligned with the chip via, and patterning connection metallization on selected portions of the first side of the interconnect layer and in the via so as to extend to the second side metallized portion and to the chip pad. About the chip is molded a "substrate" or other dielectric material.

In U.S. Pat. No. 6,084,306, entitled "Bridging Method of Interconnects for Integrated Circuit Packages", issued Jul. 4, 2000, there is described an integrated circuit package having first and second layers, a plurality of routing pads being integral with the first layer, a plurality of upper and lower conduits, respectively, disposed on the upper and lower surfaces of the first layer, one of the upper conduits electrically connected to one of the lower conduits, a plurality of pads disposed on the second layer, vias that electrically connect the pads to the lower conduits and a chip adhered to the second layer having bonding pads, at least one of which is electrically connected to one of the routing pads.

In U.S. Pat. No. 5,831,833, entitled "Bare Chip Mounting Printed Circuit Board and a Method of Manufacturing Thereof by Photo-etching", issued Nov. 3, 1998, there is described a method of manufacturing a "bare chip" multi-layer printed circuit board in which arbitrary numbers of wiring circuit conductor layers and insulating layers are alternately stacked on one or both surfaces of a printed circuit board as a substrate, and a recessed portion with an upper opening capable of mounting and resin-encapsulating a bare chip part is formed on the surface of the printed circuit board. In what appears to be the preferred embodiment, one of the insulating layers is made from a photosensitive resin, and the bare chip part mounting recessed portion is formed by photo-etching the insulating layer made from the photo-sensitive resin.

In U.S. Pat. No. 5,426,263, entitled "Electronic Assembly Having a Double-sided Leadless Component", issued Jun. 20, 1995, there is described an electronic assembly which has a double-sided leadless component and two printed circuit boards. The component has a plurality of electrical terminations or pads on both opposing major surfaces. Each of the printed circuit boards has a printed circuit pattern that has a plurality of pads that correspond to the electrical terminations on both sides of the double-sided leadless component. The electrical terminals on one side of the component are attached to the pads on the first board and the electrical terminals on the other side of the leadless component are attached to the pads on the second board. The printed circuit boards are joined together to form a multi-layered circuit board so that the double-sided leadless component is buried or recessed inside. The component is attached to the pads of the printed circuit board using solder.

In U.S. Pat. No. 5,280,192, entitled "Three-dimensional Memory Card Structure With Internal Direct Chip Attachment", issued Jan. 18, 1994, there is described a card structure which includes an internal three dimensional array of implanted semiconductor chips. The card structure includes a power core and a plurality of chip cores. Each chip core is joined to the power core on opposite surfaces of the power core, and each chip core includes a compensator core having a two dimensional array of chip wells. Each chip well allows for a respective one of the semiconductor chips to be implanted therein. Further, a compliant dielectric material is disposed on the major surfaces of the compensator core except at the bottoms of the chip wells. The compliant dielectric material has a low dielectric constant and has a thermal coefficient of expansion compatible with those of the semiconductor chips and the compensator core, so that thermal expansion stability with the chips and the compensator core is maintained.

In U.S. Pat. No. 5,099,309, entitled "Three-dimensional Memory Card Structure With Internal Direct Chip Attachment", issued Mar. 24, 1992, there is described a memory card structure containing an embedded three dimensional array of semiconductor memory chips. The card structure includes at least one memory core and at least one power core which are joined together in an overlapping relationship. Each memory core comprises a copper-invar-copper (CIC) thermal conductor plane having a two dimensional array of chip well locations on each side of the plane. Polytetrafluoroethylene (PTFE) covers the major surfaces of the thermal conductor plane except at the bottoms of the chip wells. Memory chips are placed in the chip wells and are covered by insulating and wiring levels. Each power core comprises at least one CIC electrical conductor plane and PTFE covering the major surfaces of the electrical conductor plane. Provision is made for providing electrical connection pathways and cooling pathways along vertical as well as horizontal planes internal to the card structure.

In U.S. Pat. No. 5,016,085, entitled "Hermetic package for integrated circuit chips, issued May 14, 1991, there is described a hermetic package which has an interior recess for holding a semiconductor chip. The recess is square and set at 45 degrees with respect to the rectangular exterior of the package. The package uses ceramic layers which make up the package's conductive planes with the interior opening stepped to provide connection points. The lowest layer having a chip opening therein may be left out of the assembly to provide a shallower chip opening recess.

In U.S. Pat. No. 4,956,694, entitled "Integrated circuit chip stacking", issued Sep. 11, 1990, there is described a device for increasing the density of integrated circuit chips on a printed circuit board. A plurality of integrated circuits are packaged within chip carriers and stacked, on one top of the other, on a printed circuit board. Each of the input/output data terminals, power and ground terminals of the chips are connected in parallel. Each chip is individually accessed by selectively enabling the desired chip.

It is thus seen from the above patents that various methods have been implemented for more closely "bonding" electronic components such as semiconductor chips and a substrate as one integral assembly, including the use of chip "recesses" with an appropriate cover or like material and, more specifically, as seen in two of these patents (U.S. Pat. Nos. 5,099,309 and 5,280,192), use of internal chip placement and coupling amongst the substrate's layered structure itself.

As understood from the following, the present invention represents a significant advancement over the above structures and methods by providing a circuitized substrate in which one or more organic memory devices are integrally formed as part of the substrate's mutilayered structure and capable of effectively operating in conjunction with other components such as logic semiconductor chips located externally of the substrate. The formed substrate assures effective coupling of the integrally formed memory devices to conductive layers (e.g., signal lines, power or ground planes, etc.) of the substrate while also assuring optimum heat removal so as to maintain long component life. The invention is able to do so expeditiously in such a manner that the method of forming the substrate can be carried out using many known PCB manufacturing processes with little modification thereto, thus assuring a final product without a corresponding relatively high price tag.

The invention so defined is also able to provide internal memory devices capable of being electrically coupled to such external components as a logic semiconductor chip with little or no signal "noise" and with significantly reduced impedance. In general, any structure that allows a signal to propagate from one point to another may be defined as a transmission line (in a PCB, such a line may be referred to as a "trace" if part of a substrate conductive layer, a plated "thru-hole" (PTH) if rendered conductive (e.g., plated with a metal such a copper), or even a conductive plane (e.g., power or ground) if in substantially solid, planar configuration. As a signal propagates along this line, both voltage and current are present. The ratio of these two parameters is defined as the characteristic impedance of the line which is a property determined solely by the material and geometry of the line. The characteristic impedance is proportional to the ratio of the inductance and capacitance of the line. In general, impedance is dependent upon frequency, but for lines that are essentially lossless, it can be considered constant. In signal lines, including PTHs for coupling "traces" with other "traces" on different conductive layers, ideally the signal arriving at the receiving end will be the same as that which entered the line at the driver end. However, if the transmission line changes characteristic impedance at any point along the way, signal behavior becomes more complicated. At the interface where such an impedance change occurs, partial reflections of the signal will be created. These reflected waves will travel back toward the source for possible reflection a second time. At each interface where an impedance change occurs, a reflected signal will thus be created. The reflections caused by these impedance mismatches have the ability to alter the original signal transmission, even possibly causing such problems as logic circuits to switch inadvertently. Furthermore, as signal "rise times" drop below a certain level (in highly dense PCB structures, 1 nanosecond (ns)), PCB thru-holes, including the relatively short internal "vias" mentioned above, may possibly create large enough reflections as to potentially cause significant signal transmission concerns. Consequently, as clock rates increase and signal rise times become short, as is currently being demanded in many of today's products, all portions of the interconnection path need to be well matched to the impedances of the other parts of the substrate and to the electronic components these lines interconnect. With particular attention to internal or other "vias" (as stated, all referred to as thru-holes herein), the capacitance created is by way of a stray electric field present between the via and the various power, ground or signal layers in the PCB. The inductance of the via is related to the magnetic field surrounding the portion of the via carrying the signal current. Typically, the inductance of the via is quite small relative to its capacitance. As such, most vias exhibit very low impedance and are a poor match to typical PCB traces. Reducing the via's capacitance or increasing the via's inductance will raise the via's impedance and create an improved match. This improvement will improve the capability to carry higher data rates from the internally positioned chip(s) through the via(s) to the substrate's external surfaces and thus to external components coupled to the substrate. The unique structure of the instant invention is able to provide effective coupling between an internal memory device and an external semiconductor chip or the like while substantially overcoming the aforementioned problems associated with other structures.

It is believed that such a substrate, method of making same, and various products utilizing same will constitute significant advancements in the art.

OBJECTS AND SUMMARY OF THE INVENTION

It is, therefore, a primary object of the present invention to enhance the circuitized substrate art.

It is another object of the invention to provide a circuitized substrate which includes at least one (and possibly several) internally formed organic memory device as part of the multilayered circuitized substrate and adapted for being electrically coupled to designated electronic components (especially logic semiconductor chips) located externally (and perhaps positioned directly or indirectly on) of the substrate.

It is another object of the invention to provide a method of making such a substrate and internal organic memory device combination which can be accomplished utilizing many known PCB manufacturing processes and thus without a significant increase in the cost for making such a relatively complex final structure.

It is yet another object of the invention to provide various assemblies which effectively utilize one or more of the circuitized substrates having the unique features taught herein.

According to one embodiment of the invention, there is provided a circuitized substrate comprising at least one layer of organic dielectric material and at least one electrically conductive circuit formed on the layer of organic dielectric material, part of the at least one layer of organic dielectric material and a corresponding part of the at least one electrically conductive circuit forming at least part of an organic memory device.

According to another embodiment of the invention, there is provided a method of making a circuitized substrate comprising providing at least one layer of organic dielectric material, and forming at least one electrically conductive circuit on the layer of organic dielectric material, part of the at least one layer of organic dielectric material and a corresponding part of the at least one electrically conductive circuit forming at least part of an organic memory device.

According to still another embodiment of the invention, there is provided an electrical assembly comprising a circuitized substrate including at least one layer of organic dielectric material and a first electrically conductive circuit formed on the layer of organic dielectric material, part of the at least one layer of organic dielectric material and a corresponding part of the first electrically conductive circuit forming at least part of an organic memory device, a thin layer of polymer material positioned on the corresponding part of the first electrically conductive circuit which forms at least part of the organic memory device, and a second electrically conductive circuit formed on the thin layer of polymer material, this second electrically conductive circuit and corresponding part of the first electrically conductive circuit each comprising a plurality of extremely narrow, linear circuit lines which cross each other at predetermined locations to define points of contact at the locations and thereby define an organic memory device. The electrical assembly further includes at least one electrical component positioned on said circuitized substrate and electrically coupled to the at least one electrically conductive circuit.

According to yet another embodiment of the invention, there is provided an information handling system comprising a housing, an electrical assembly positioned substantially within the housing and including a circuitized substrate having at least one layer of organic dielectric material and a first electrically conductive circuit formed on the layer of organic dielectric material. Part of the at least one layer of organic dielectric material and a corresponding part of the first electrically conductive circuit form at least part of an organic memory device. The substrate further includes a thin layer of polymer material positioned on the corresponding part of the first electrically conductive circuit which forms at least part of the organic memory device, and a second electrically conductive circuit formed on the thin layer of polymer material, this second electrically conductive circuit and the corresponding part of the first electrically conductive circuit each comprising a plurality of extremely narrow, linear circuit lines which cross each other at predetermined locations to define points of contact at such locations and thereby define the organic memory device. Further, the system includes at least one electrical component positioned on the circuitized substrate of the electrical assembly and electrically coupled to the at least one electrically conductive circuit of this circuitized substrate.

BRIEF DESCRIPTION OF THE DRAWINGS

FIGS. 1-3A are partial perspective views showing three steps in forming a circuitized substrate according to one embodiment of the invention, the view in FIG. 3A showing the formation of an organic memory device in accordance with one embodiment of the invention;

BEST MODE FOR CARRYING OUT THE INVENTION

Figure 1:
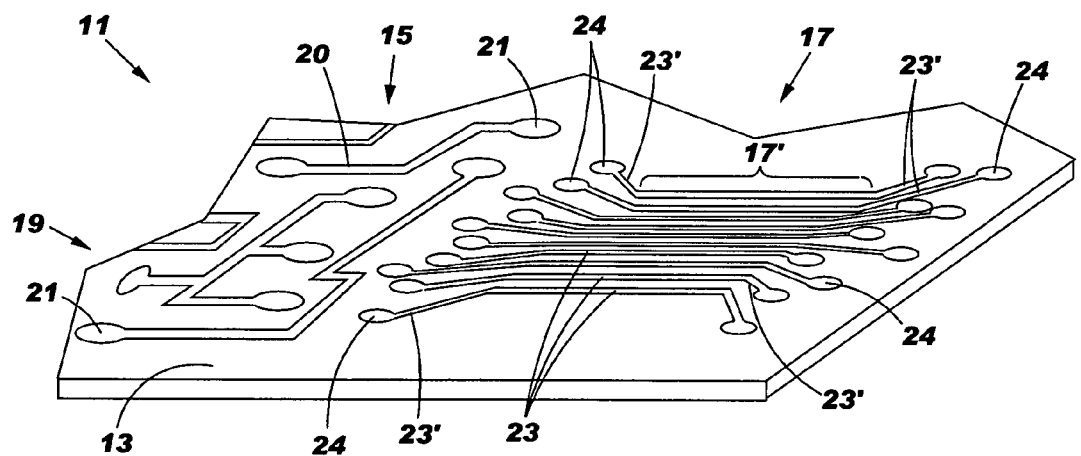

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

The following terms will be used herein and are understood to have the meanings associated therewith.

By the term "circuitized substrate" is meant to include substrates having at least one dielectric layer and one conductive layer. In many cases, such substrates will include several dielectric and conductive layers. Examples include printed circuit boards (PCBs) or like structures made of dielectric materials such as fiberglass-reinforced epoxy resins, polytetrafluoroethylene (Teflon), polyimides, polyamides, cyanate resins, photoimageable materials, and other like materials wherein the conductive layer is a metal layer (e.g., power or signal plane) comprised of suitable metallurgical materials such as copper but may include or comprise additional metals (e.g., nickel, aluminum, etc.) or alloys thereof. A preferred dielectric material is polyimide. If the dielectric is a photoimageable material, it is photoimaged or photopatterned, and developed to reveal the desired circuit pattern, including the desired opening(s) as defined herein, if required. The dielectric material may be curtain-coated or screen-applied, or it may be supplied as dry film. Final cure of the photoimageable material provides a toughened base of dielectric on which the desired electrical circuitry is formed. An example of a specific photoimageable dielectric composition includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photoimageable dielectric composition. The dielectric layers taught herein may be typically about 2 mils to about 4 mils thick.

By the term "circuitized substrate assembly" as used herein is meant to include at least two of such circuitized substrates in a bonded configuration, one example of bonding being conventional lamination procedures known in the art and another being the use of conductive paste to couple two formed substrates along a common pattern of conductors (e.g., thru-holes).

By the term "electronic component" as used herein is meant components such as semiconductor chips, resistors, capacitors and the like, which are adapted for being positioned on the external conductive surfaces of such substrates as PCBs and possibly electrically coupled to other components, as well as to each other, using, for example the PCB's internal and/or external circuitry.

By the term "organic memory device" as used herein is meant an electrically functioning structure capable of amplification, oscillation and/or switching actions, having an organic material as its dielectric and appropriate metallurgical or other electrically conductive materials as its electrically conductive circuitry. Such a device will include at least two such dielectric layers and a corresponding number of conductive circuits.

By the term "electrically conductive paste" as used herein is meant to include a bondable (e.g., capable of lamination) conductive material capable of being dispensed within openings of the type taught herein. Typical examples of bondable electrically conductive material are conductive pastes such as silver filled epoxy paste obtained from E.I. duPont deNemours and Company under the trade designation CB-100, Ablebond 8175 from the Ablestick Company and filled polymeric systems, thermoset or thermoplastic type, containing transient liquid conductive particles or other metal particles such as gold, tin, palladium, copper, alloys, and combinations thereof. One particular example is coated copper paste. Metal coated polymeric particles disposed in a polymeric matrix can also be used.

By the term "sticker sheet" as used herein is meant to include dielectric materials such as conventional pre-preg materials used in conventional, multilayered PCB construction, e.g., usually by lamination. Other examples include the products Pyrolux and liquid crystal polymer (LCP) or other freestanding films. These dielectric sticker sheets may be adhesively applied to one or both of the two circuitized substrates to assist in bonding these two components. These sheets may also be patterned, e.g., by laser or photoimaging, if desired. Significantly, such sheets can also include a conductive plane (including signal, ground and/or power) therein to further increase the circuit density of the finished, bonded product taught herein. Such sticker sheets may be typically 5 to 8 mils (thousandths) thick.

By the term "electrical assembly" is meant at least one circuitized substrate as defined herein in combination with at least one electronic component electrically coupled thereto and forming part of the assembly. Examples of known such assemblies include chip carriers which include a semiconductor chip as the electronic component, the chip usually positioned on the substrate and coupled to wiring (e.g., pads) on the substrate's outer surface or to internal conductors using one or more thru-holes By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB can be referred to as a "motherboard" while various other boards (or cards) may be mounted thereon using suitable electrical connectors.

In FIG. 1, there is shown a first step of producing a circuitized substrate according to one embodiment of the invention. Substrate 11 is shown to include at least one layer 13 of organic dielectric material having thereon at least two different portions 15 and 17 of an electrically conductive circuit 19. In a preferred embodiment, layer 13 is comprised of polyimide but may also be of one of the other dielectric materials described above. In one embodiment, layer 13 may possess a thickness of only from about 0.0005 inch (") to about 0.010" and have width and length dimensions typical of those presently used in the printed circuit board (PCB) industry. In one example, layer 13 may have a width of about 18" and a length of about 24". Such dimensions are not limitive of the invention, however, as the circuitized substrate produced in accordance with the teachings herein may be of any width and length dimensions, depending on final product requirements.

The conductive circuit 19 is preferably formed using conventional photolithographic processing known in the PCB industry and further description is not believed necessary. Such circuitry is preferably copper but may be of other conductive materials, including aluminum, alloys of copper or aluminum, conducting polymers, or combinations thereof. Portion 15 of conductive circuit 19 is formed having conventional lines 20 (traces) and other circuit elements (i.e., pads 21) coupled to such lines, depending on the predetermined circuit design. Such lines as shown in FIG. 1 may thus have a width of from about 0.001" to about 0.008" and the resulting pads 21 may be of substantially round configuration with a diameter of from about 0.005" to about 0.030". Other elements and/or configurations may form part of the portion 15 of circuit 19, as is known in PCB manufacturing.

Significantly, portion 17 of circuit 19 is of a highly dense pattern, for reasons explained hereinbelow. This pattern is preferably comprised of several parallel linear lines 23 which form a substantially rectangular (preferably square) pattern 17' as shown in FIG. 1. That is, only the linear lines form the square pattern and include at the ends thereof a plurality of extension lines 23' which terminate in corresponding pads 24. In a preferred embodiment, each line 23 possesses a width of only from about five to about fifty microns and a length of only from about 0.1" to about 2.5", and the resulting extending lines 23' and associated pads 24 possess a width also of from about five to about fifty microns and diameters from about 0.005" to about 0.030", respectively. The projecting lines 23' and pads 24 may be of similar dimensions to those shown in the first portion 15 of circuit 19, but it is essential that the parallel singular trace lines (traces) 23 possess the extremely narrow width, highly dense pattern described. It is understood that lines 23 and the corresponding projecting lines and pads form the first layer of an organic memory device in accordance with one embodiment of the teachings herein. As seen, this memory device circuitry is formed simultaneously with that of the conventional circuitry of a PCB.

Figure 2:
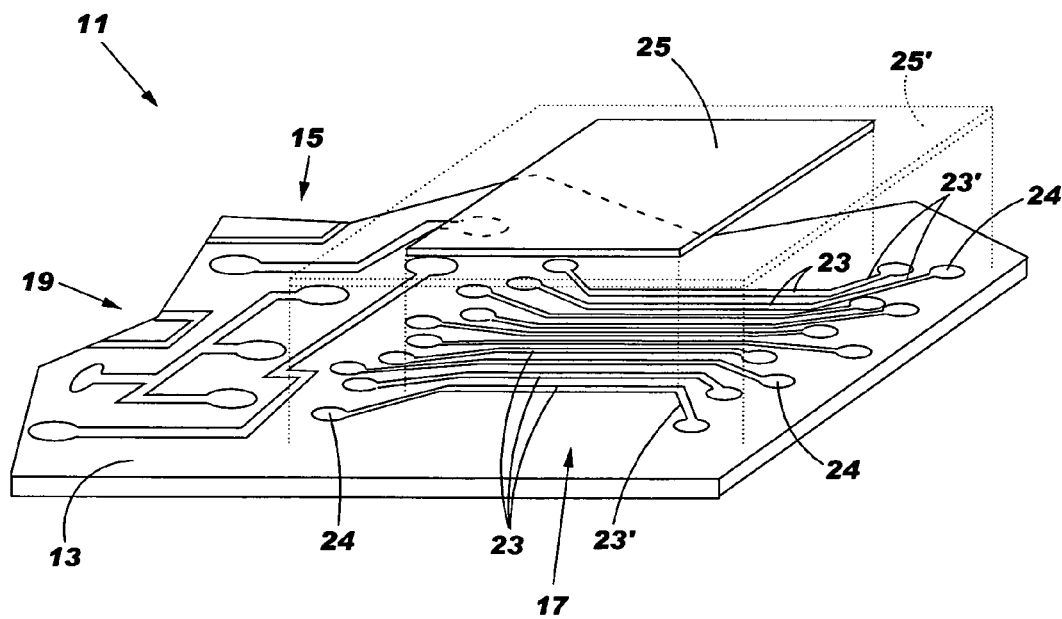

FIG. 2 represents the second step of forming the circuitized substrate including at least one organic memory device according to one embodiment of the invention. A second dielectric layer 25 is aligned over the linear pattern 17' of conductive lines 23 and deposited thereon. Such deposition is preferably done using conventional PCB equipment, depending on the chosen process (or combination of processes) to be utilized to accomplish the dielectric layer positioning. Acceptable processes include spin coating, roller coating, draw coating, slot coating, curtain coating, and printing. Other organic film deposition techniques such as electrostatic deposition coating or lamination may also be employed. The second organic dielectric layer 25 is preferably a polymer, and more preferably a ferroelectric thin film material. Preferred examples of such thin film materials usable in the instant invention include polyvinylidene and copolymers thereof such as polyvinylidene fluoride-trifluoroethylene (PVDF-TFE), and nylons (preferably odd-numbered) and copolymers thereof. Other materials are also acceptable provided these assure the needed properties of those identified. According to one embodiment, each layer 25 possesses a thickness of only about 0.5 to three microns with sided dimensions of 0.2" to about 3". As stated, the pattern 17' on which the second layer 25 is positioned is preferably square, and thus so is the thin layer 25.

Figure 3A:
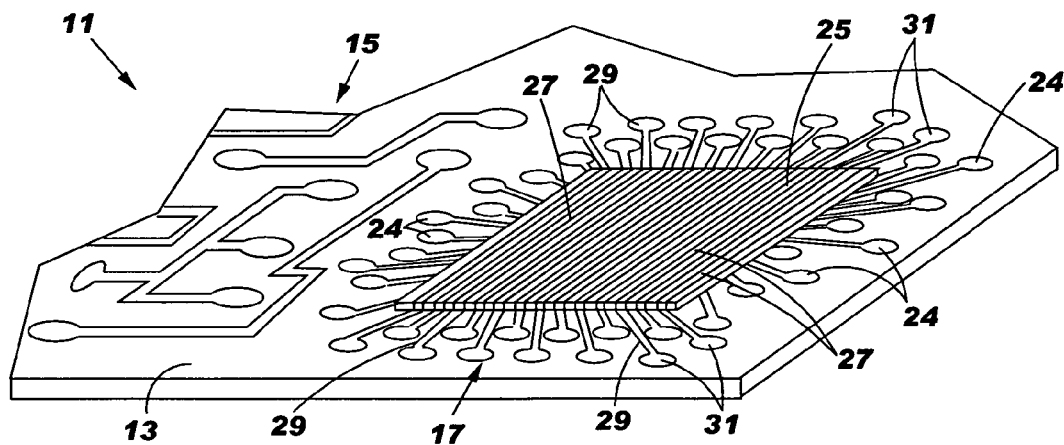

In FIG. 3A, there is shown a third step of forming an organic memory device (in its simplest form) as part of a circuitized substrate according to one embodiment of the invention. In this step, a second substantially square pattern of linear electrically conductive lines (traces) is formed atop the surface of ferroelectric thin film layer 25. These lines, each represented by the numeral 27, are preferably of similar width (and length) to lines 23 in FIG. 2 but run in a pattern substantially perpendicular thereto. Clearly, these lines are also electrically conductive and also preferably of a material similar to lines 23. Of significance, it is noted in FIG. 3A that the formation of lines 27, preferably accomplished using photolithographic processing, results in the extension of lines down the sides of the ferroelectric thin film layer 25 at opposing ends thereof and the resulting formation of extensions 29 on the upper surface of dielectric layer 13. Such extension lines 29 each preferably terminate in a pad 31 such that an opposing array of such pads are formed and correspond to the similarly opposing array of pads 24 for the first layer of lines 23. Again, the ultimate use for pads 24 and 31 will be described below. These pads and the extension lines thereto possess similar dimensions as the extensions 23' and terminal pads 24 for the first layer.

It is thus seen in FIG. 3A that two separate parallel patterns of linear traces are formed and result in corresponding pads at the end thereof in such an orientation that both conductive patterns are completely electrically isolated from each other by the spacing on the upper surface of layer 13 and, most importantly, the thickness of the ferroelectric thin film layer 25.

Figure 4:
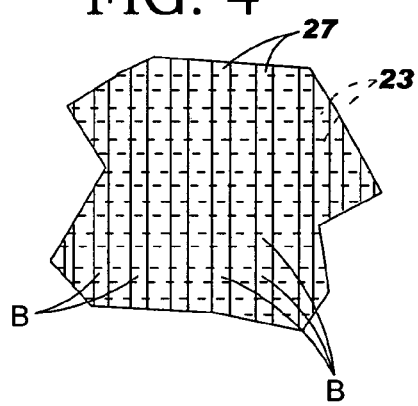
FIG. 4 is an enlarged partial plan view showing the crossing pattern of linear circuit lines of an organic memory device for the substrates shown in both FIGS. 3A and 3B.

FIG. 4 is an enlarged, partial plan view illustrating the intersection of parallel lines 23 (hidden) and 27. Each point B forms a "bit" of the resulting memory device. When an electrical field is established across a corresponding pair of intersecting lines 23 and 27, as caused by the passage of current through these intersecting lines, at the corresponding predetermined bit B, the memory cell is switched between two polarization states of the ferroelectric thin film material. As stated, the formation of two parallel layers represents the simplest form of a memory device and that it is preferred to form one with substantially more layers of conductors and ferroelectric thin film materials to thus produce a memory device with much greater capability than that shown. By way of example, such a memory device produced in accordance with the teachings herein may include from the defined two to about ten conductive layers with a corresponding number of interim ferroelectric thin film layers. Should additional layers be desired and the conductors extend down the sides of the ferroelectric thin film layers, it is understood that narrower patterns for the individual lines would be essential. The pattern illustrated in the drawings is therefore not necessarily to scale but may be of different widths than those shown, depending on such number of conductive layers desired for the final product.

Figure 3B:
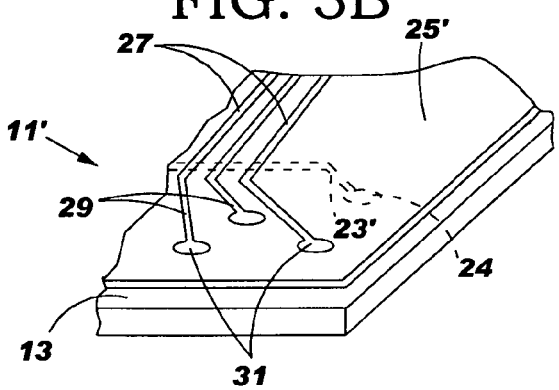
FIG. 3B is a partial perspective view similar to part of FIG. 3A, representing an alternative embodiment of how the second layer of circuitry on the invention's organic memory device may be formed in comparison to the method shown in solid in FIG. 3A.

FIG. 3B represents an alternative version of forming the second (and additional, if desired) conductive layers of an organic memory device of the invention. In FIG. 3B, the ferroelectric thin film layer 25' for this circuitized substrate (now referenced by numeral 11') extends beyond the boundaries of the substantially square pattern 17' of first layer linear traces 23 to approximately the same distance from the pattern as the underlying first pads 24 and connecting lines 23' (only one such line and pad are shown (hidden) in FIG. 3B for illustration purposes). This enables the formation of coplanar extension lines 29 and pads 31 for each of the individual lines 27 on the upper surface of the extended, larger ferroelectric thin film layer 25'. It is not necessary, therefore, that these lines extend down the side of a smaller ferroelectric thin film layer as in the embodiment of FIG. 3A. This alternative ferroelectric thin film sheet 25' is shown in phantom in FIG. 2 and thus illustrative of its approximate size relative to the underlying first pattern of conductors 23. Adhesion of the second, alternative layer 25' is preferably accomplished similarly to that for layer 25 and the simultaneous formation of linear traces 27 and extension lines 29 and pads 31 in the illustrative coplanar pattern is preferably accomplished using photolithography processing as was the second pattern in FIG. 3A.

Figure 5:
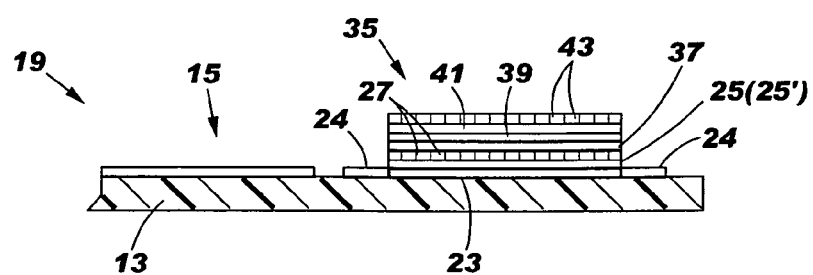
FIG. 5 is an enlarged, partial side elevational view, in section, of the circuitized substrates of both FIGS. 3A and 3B.

FIG. 5 is a partial side elevational view showing only the first dielectric layer 13 and the first portion 15 of circuit 19 and the first and second conductive layers of the memory device in its simplest form as shown and described hereinabove, with the addition of another layer of conductors and interim ferroelectric thin film layers. The device, represented by the numeral 35, thus includes the defined first layer of circuitry comprised of parallel lines 23 (only one shown) and projecting pads 24, all on the planar upper surface of layer 13. The ferroelectric thin film layer 25 (or 25' if the FIG. 3B embodiment is chosen) is also shown and the subsequent individual linear lines 27 (facing the viewer in FIG. 5). Atop this second layer is yet a second ferroelectric thin film layer 37 similar to one of the layers 25 and 25' and atop this another circuit pattern of linear conductors 39 (only one shown). Atop this second linear array of traces 39 is a third ferroelectric thin film layer 41 and atop this layer yet another conductive layer of individual parallel traces 43 (facing the viewer in FIG. 5). The embodiment of FIG. 5 is thus meant to better illustrate the multi-stacked embodiment for a memory device which can be formed in accordance with the unique teachings herein wherein more than simply two conductive layers are chosen.

Figure 6:
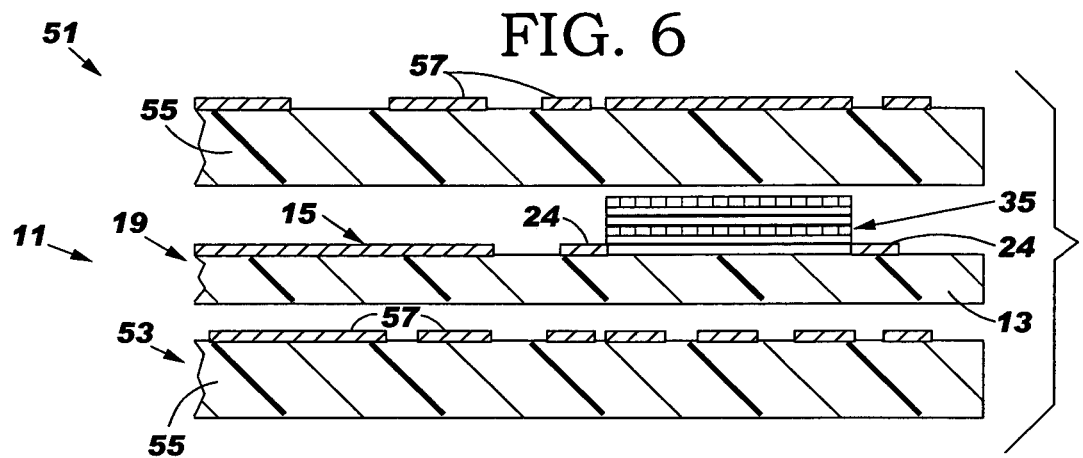
FIGS. 6-8 are enlarged, partial side elevational views showing the formation of a multilayered circuitized substrate which includes the substrate of either FIG. 3A or 3B as part thereof, FIG. 6 being an exploded view to better illustrate the initial layers of the resulting structure in FIG. 8.
Figure 7:
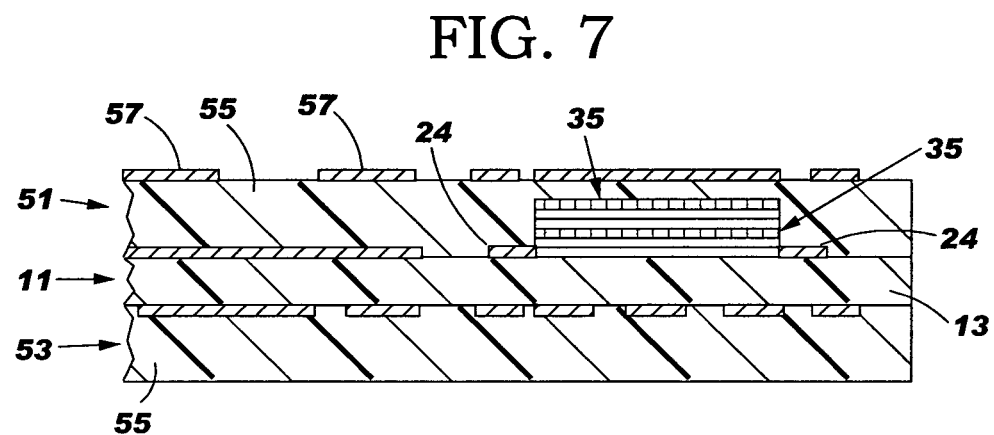
Figure 8:
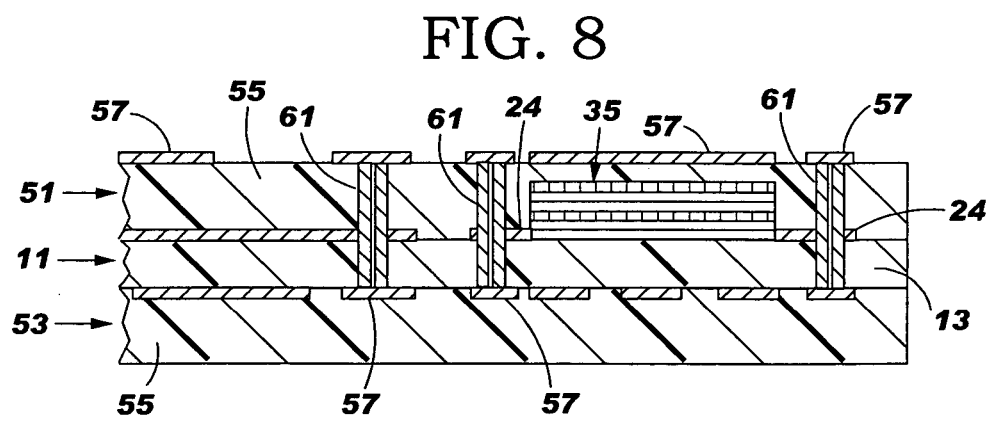

FIGS. 6-8 illustrate the steps of forming a multilayered circuitized substrate according to one embodiment of the invention. The resulting substrate will include at least one of the circuitized substrates 11 defined above including at least one organic memory device 35 as part thereof. The memory device in FIGS. 6-8 is shown only schematically and not to the detail in FIG. 5 or preceding FIGS. The circuitized substrate 11 is aligned with additional circuitized substrates 51 and 53 on opposite sides thereof. Each substrate 51 and 53, as defined above, includes at least one dielectric layer 55 and a conductive circuit layer including, e.g., circuit elements 57 (lines and/or pads) thereon. The dielectric layers 55 may be of conventional PCB materials as described above, including, significantly, a material dissimilar to that of substrate 11. For example, it is within the scope of the invention to utilize the aforementioned polyimide dielectric for substrate 11 and mate this substrate with opposing substrates having the conventional "FR4" (fiberglass-reinforced hardened epoxy resin) dielectric material. Additionally, these additional substrates may include circuit elements of different metallurgy and/or thicknesses and widths. Preferably, the circuitry which forms elements 57 is similar to that which forms the first part 15 of circuit 19 for substrate 11.

FIG. 7 shows the three circuitized substrates bonded together, preferably utilizing conventional lamination processing in which predetermined temperatures and pressures are utilized. According to the teachings herein, it is not necessary to alter these pressures and temperatures over conventional such parameters to form the multilayered substrate taught herein. The result of such lamination is the secure bonding of all three layers. Prior to such formation, it may be desirable to provide an interim "sticker sheet" dielectric layer between each spaced pair of substrates, such a material known in the art and described above. It is also within the scope of this invention to bond conductors on one substrate (e.g., assuming such conductors were formed on the underside of the top substrate and/or substrate 11) using a suitable conductive paste, several types of which are known in the art.

In FIG. 8, the next step of forming the multilayered circuit structure is shown, this being the provision of thru-holes 61 within the structure. Thru-holes 61 are formed using conventional PCB technology in which individual holes are drilled (e.g., using mechanical drills or lasers) within the substrate after which a conductive thin layer (e.g., copper) is plated onto the surfaces of the openings. The thru-holes 61 are designed to interconnect selected ones of the elements 57 and, as seen in FIG. 8, to the respective pads 24 which extend from the memory device 35 to thus connect these pads 24 to respective other elements 57 as desired.

The embodiment of FIG. 8 is understood to represent a simplistic view of one embodiment of the invention. It is understood that in a preferred embodiment, several additional circuitized layers will be utilized to provide additional functioning capability for the resulting structure as is demanded in today's rapidly expanding technologies which utilize such circuitized structures. For example, as many as forty individual substrates may be combined and laminated together to form such a multilayered structure. The embodiment in FIG. 8 and others as shown herein are thus represented in such a format for ease and brevity of illustration and description.

Figure 9:
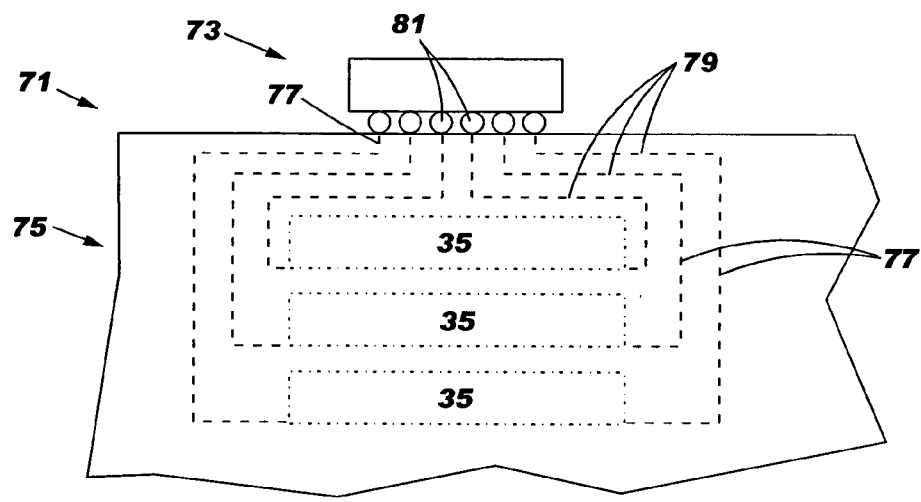
FIG. 9 is a schematic view illustrating the utilization of a plurality of internal organic memory devices within a multilayered substrate and a representative pattern of how each of these may be electrically coupled to an external electronic component such as a logic semiconductor device (chip)

FIG. 9 represents an electrical assembly 71 according to one embodiment of the invention. This assembly is shown to include a plurality of internal organic memory devices 35 arranged in a substantially vertical, stacked orientation and formed in the manner described above. Assembly 17 thus includes a plurality of circuitized substrates to result in a multilayered construction in which the circuitized substrates described above form only one aspect thereof. In the embodiment of FIG. 9, each of the organic memory devices is shown schematically as being electrically coupled upwardly to an electronic component 73 which in turn is positioned on a top surface of the underlying multilayered substrate 75 including the invention. These forms of connection between the internal memory device and external component 73 are preferably accomplished using a specified pattern of thru-holes 77 as described in FIG. 8 in combination with linear signal layers 79 which terminate on the upper surface of the substrate 75 in a plurality of pads such as those described hereinabove. Such pads in turn may be electrically coupled to component 73 using solder balls 81 of conventional material. One example of an electronic component 73 is preferably a logic semiconductor device (chip) and thus the electrical assembly 71 may be referred to as a chip carrier or the like. Additionally, this substrate may form a multilayered PCB and include several such chips thereon. Thus, the internal memory devices formed within the multilayered circuitized substrate shown in FIG. 9 may work in conjunction with a corresponding logic chip (more than one, preferably) to provide a finished electrical assembly with enhanced capabilities without the need for additional semiconductor chips (e.g., memory chips) also located on the assembly's external surface(s), thus saving significant board real estate for such a product while in turn enhancing miniaturization thereof. These represent significantly advantageous features of the present invention and are obviously highly desired in the electronic packaging art.

Figure 10:
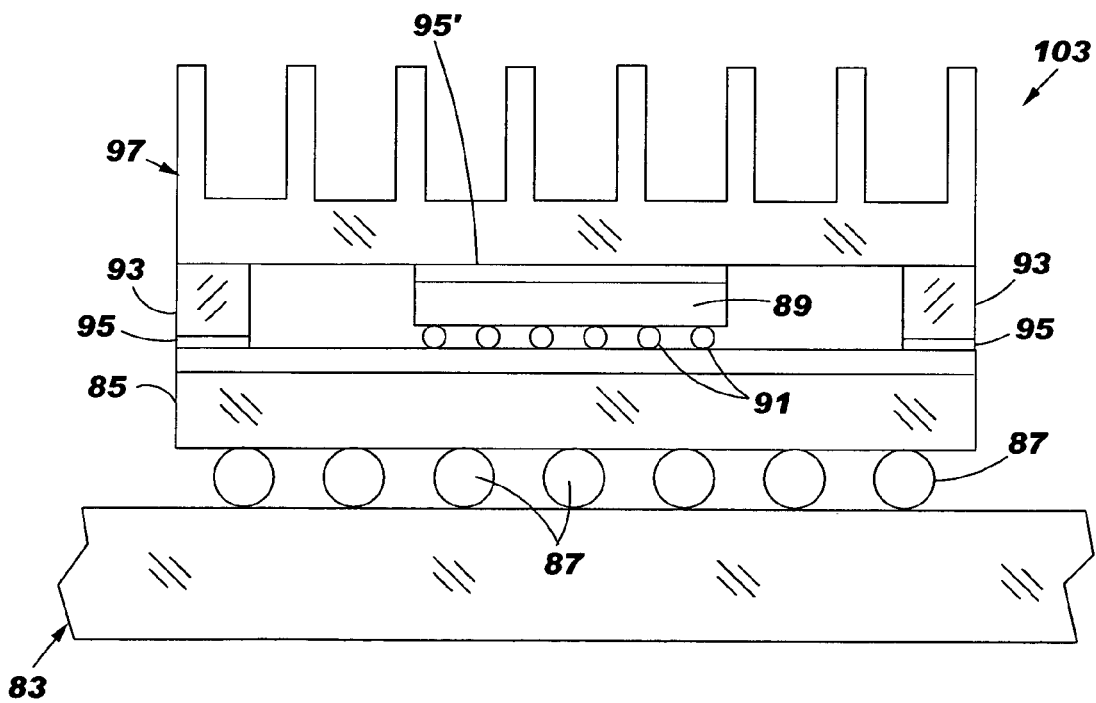
FIG. 10 is an elevational view of an electrical assembly capable of utilizing the circuitized substrate of the instant invention.

FIG. 10 represents an example of an electrical assembly including various components which utilize the circuitized substrates of the instant invention. For example, the structure referred to by the numeral 83 may be a PCB and include conventional internal multilayers of circuits and dielectric layers as known in the art. Atop this PCB and electrically coupled thereto is a second, smaller assembly 85, known in the art as a chip carrier substrate, which in turn is electrically coupled to the underlying, larger PCB 83 using a plurality of solder balls 87 of conventional metallurgy (typically a lead and tin composition). Positioned on and electrically coupled to the carrier substrate 85 is a semiconductor chip, such as a logic chip 89 which in turn is electrically coupled to the underling substrate 85, also preferably using solder balls 91 of conventional composition. Standoffs 93 secured to the substrate 85 using an adhesive 95 are also used to position a heat sink 97 atop the hotter operating logic semiconductor chip 89 and secured to the chip, also using an adhesive 95'. Such heat sinks, adhesives and standoffs, if utilized, are known in the art and further description is not believed needed. With respect to the instant invention, the multilayered substrate 85 may be similar to that shown in FIG. 8 (more preferably in FIG. 9) with the corresponding chip 89 being a hotter, logic chip which may require additional heat-sinking as provided by the thermally bonded heat sink 97. It is also within the scope of the invention for PCB 83 to include one or more internal memory devices as part thereof, these devices in turn electrically coupled to substrate 85 and its internal memory devices and/or external logic chip to add yet further memory capabilities for the instant invention.

Figure 11:
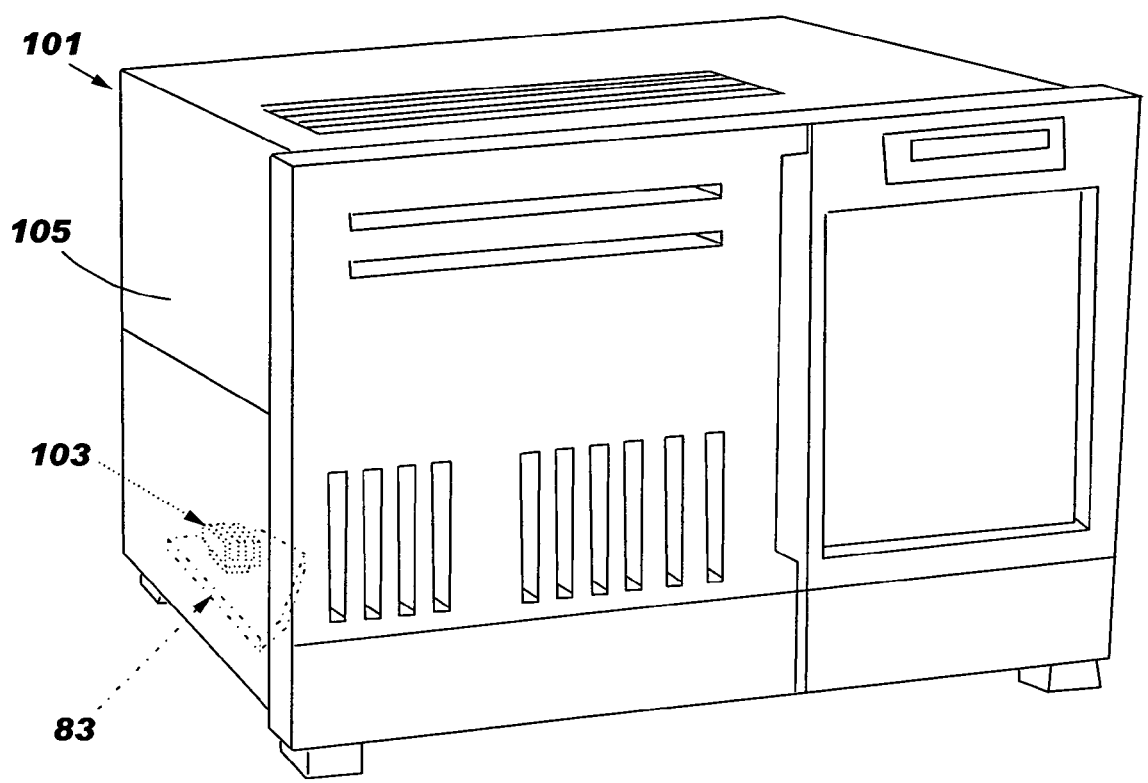
FIG. 11 is a perspective view, on a much reduced scale, of an information handling system capable of utilizing one or more of the circuitized substrates of the invention as may be embodied within various electrical assemblies as taught herein and otherwise discernible from the teachings of this invention.

In FIG. 11, there is shown an information handling system 101 in accordance with one embodiment of the invention. System 101 may comprise a personal computer, mainframe computer, computer server, or the like, several types of which are well known in the art. System 101, as taught herein, may include the electrical assembly as shown in FIG. 10 and represented by the numeral 103. This assembly, shown hidden, is preferably mounted on a larger PCB or other substrate such as PCB 83 in FIG. 10. These components are shown hidden because these are encased within and thus behind a suitable housing 105 designed to accommodate the various electrical and other components which form part of system 101. PCB 83 may form a "motherboard" in system 101 and thus include additional PCBs (printed circuit "cards") and assemblies such as assembly 103 as part thereof. It is thus seen and understood that the circuitized substrate made in accordance with the unique teachings herein may be utilized in several various structures as part of a much larger system, such as information handling system 101. Further description is not believed necessary.

Thus there has been shown and described a circuitized substrate which provides, uniquely, for an internal organic memory structure which functions similarly to semiconductor chips of silicon and other materials which are conventionally positioned externally of circuit boards and the like and must be formed using complex chip technology. The internal memory devices taught herein are formed using conventional PCB technology with relatively minor modification thereto and thus result in an end product possessing significant capabilities but which is attainable at relatively inexpensive cost compared to that of independent chip formation and subsequent attachment and coupling to the corresponding substrate to which these are secured. Significantly, the internal memory device taught herein is operable in such an environment as also taught herein without causing damage, e.g., by excessive heat formation, to the adjacent and other layers which constitute the final substrate structure. It is believed that this invention, therefore, represents a significant advancement in the art for these reasons and others discernible from the teachings herein.

While there have been shown and described what are at present the preferred embodiments of the invention, it will be obvious to those skilled in the art that various changes and modifications may be made therein without departing from the scope of the invention as defined by the appended claims.

What is claimed is:

1. A circuitized substrate comprising:
   a first layer of organic dielectric material; and
   a first electrically conductive circuit formed on said first layer of organic dielectric material, said first electrically conductive circuit including a first part having a plurality of lines each of a first width and a second part comprising a highly dense pattern of substantially parallel lines each of a second width less than said first width of said lines of said first part of said first electrically conductive circuit;

a thin, second layer of organic polymer material positioned on said second part of said first electrically conductive circuit comprising said highly dense pattern of substantially parallel lines; and a second electrically conductive circuit positioned on said thin, second layer of said organic polymer material and also comprising a highly dense pattern of substantially parallel lines each having a width substantially the same as said second width of said lines of said second part of said first electrically conductive circuit, part of said first layer of organic dielectric material, said second part of said first electrically conductive circuit, said thin, second layer of organic polymer material and said second electrically conductive circuit forming an organic memory device adjacent said first part of said first electrically conductive circuit;

wherein said thin, second layer of organic polymer material includes opposing ends, said substantially parallel lines of said second electrically conductive circuit further extending down the sides of said opposing ends of said thin, second layer of organic polymer material and onto said first layer of organic dielectric material.

2. The circuitized substrate of claim 1 further including a third layer of dielectric material positioned on said second electrically conductive circuit, said first part of said first electrically conductive circuit and said first layer of said organic dielectric material.

3. The circuitized substrate of claim 2 further including a conductive circuit layer positioned on said third layer of dielectric material and a plurality of thru-holes within said third layer of dielectric material, said plurality of thru-holes electrically coupling selected lines of said second part of said first electrically conductive circuit to said conductive circuit layer positioned on said third layer of dielectric material.

4. The circuitized substrate of claim 1 wherein said thin, second layer of organic polymer material comprises a ferroelectric thin film material selected from the group consisting of polyvinylidene and copolymers thereof, nylon and copolymers thereof, cyanopolymers and copolymers thereof, and combinations thereof.

5. The circuitized substrate of claim 4 wherein said ferroelectric thin film material of said thin, second layer of organic polymer material is polyvinylidene fluoridetrifluoroethylene, and has a thickness of from about 0.5 to about three microns.

6. The circuitized substrate of claim 1 wherein said substantially parallel lines of said second electrically conductive circuit formed on said thin, second layer of organic polymer material and said substantially parallel lines of said second part of said first electrically conductive circuit cross each other at predetermined locations to define points of contact at said predetermined locations to thereby define said organic memory device.

7. The circuitized substrate of claim 1 wherein selected ones of said lines of said second part of said first electrically conductive circuit and said second electrically conductive circuit each have a width of from about five to about fifty microns.

8. The circuitized substrate of claim 1 wherein said lines of said first electrically conductive circuit and said second electrically conductive circuit are each comprised of a metal selected from the group consisting of copper, copper alloy, aluminum, aluminum alloy, conductive polymers, and combinations thereof.

9. The circuitized substrate of claim 1 wherein said first layer of organic dielectric material comprises a polymer material selected from the group of polymer materials consisting of fiberglass-reinforced epoxy resins, polytetrafluoroethylene, polyimides, polyamides, cyanate resins, photoimageable materials, and combinations thereof.

10. An electrical assembly comprising:

a circuitized substrate including a first layer of organic dielectric material, a first electrically conductive circuit formed on said first layer of organic dielectric material, said first electrically conductive circuit including a first part having a plurality of lines each of a first width and a second part comprising a highly dense pattern of substantially parallel lines each of a second width less than said first width of said lines of said first part of said first electrically conductive circuit; a thin, second layer of organic polymer material positioned on said second part of said first electrically conductive circuit comprising said highly dense pattern of substantially parallel lines, and a second electrically conductive circuit positioned on said thin, second layer of organic polymer material and also comprising a highly dense pattern of substantially parallel lines each having a width substantially the same as said second width of said lines of said second part of said first electrically conductive circuit, part of said first layer of organic dielectric material, said second part of said first electrically conductive circuit, said thin, second layer of organic polymer material and said second electrically conductive circuit forming an organic memory device adjacent said first part of said first electrically conductive circuit;

wherein said thin, second layer of organic polymer material includes opposing ends, said substantially parallel lines of said second electrically conductive circuit further extending down the sides of said opposing ends of said thin, second layer of organic polymer material and onto said first layer of organic dielectric material; and at least one electrical component positioned on said circuitized substrate and electrically coupled to said first electrically conductive circuit.

11. The electrical assembly of claim 10 wherein said thin, second layer of organic polymer material comprises a ferroelectric thin film material selected from the group consisting of polyvinylidene and copolymers thereof, nylon and copolymers thereof, cyanopolymers and copolymers thereof, and combinations thereof.

12. The electrical assembly of claim 10 further including a third layer of dielectric material positioned on said second electrically conductive circuit, said first part of said first electrically conductive circuit and said first layer of organic dielectric material.

13. The electrical assembly of claim 12 further including a conductive circuit layer positioned on said third layer of dielectric material and a plurality of thru-holes within said third layer of dielectric material, said plurality of thru-holes electrically coupling selected lines of said second part of said first electrically conductive circuit to said conductive circuit layer positioned on said third layer of dielectric material.

14. The electrical assembly of claim 10 wherein selected ones of said lines of said second part of said first electrically conductive circuit and said second electrically conductive circuit each have a width of from about five to about fifty microns.

15. The electrical assembly of claim 10 wherein said first layer of organic dielectric material comprises a polymer material selected from the group of polymer materials consisting of fiberglass-reinforced epoxy resins, polytetrafluoroethylene, polyimides, polyamides, cyanate resins, photoimageable materials, and combinations thereof.

16. The electrical assembly of claim 10 wherein said substantially parallel lines of said second electrically conductive circuit formed on said thin, second layer of organic polymer material and said substantially parallel lines of said second part of said first electrically conductive circuit cross each other at predetermined locations to define points of contact at said predetermined locations to thereby define said organic memory device.

17. The electrical assembly of claim 10 wherein said at least one electrical component positioned on said circuitized substrate and electrically coupled to said first electrically conductive circuit comprises a chip carrier.

18. The electrical assembly of claim 10 wherein said at least one electrical component positioned on said circuitized substrate and electrically coupled to said first electrically conductive circuit comprises a semiconductor chip.

19. An information handling system comprising:
a housing;
an electrical assembly positioned substantially within said housing and including a circuitized substrate including a first layer of organic dielectric material, a first electrically conductive circuit formed on said first layer of organic dielectric material, said first electrically conductive circuit including a first part having a plurality of lines each of a first width and a second part comprising a highly dense pattern of substantially parallel lines each of a second width less than said first width of said lines of said first part of said first electrically conductive circuit; a thin, second layer of organic polymer material positioned on said second part of said first electrically conductive circuit comprising said highly dense pattern of substantially parallel lines; and a second electrically conductive circuit positioned on said thin, second layer of organic polymer material and also comprising a highly dense pattern of substantially parallel lines each having a width substantially the same as said second width of said lines of said second part of said first electrically conductive circuit, part of said first layer of organic dielectric material, said second part of said first electrically conductive circuit, said thin, second layer of organic polymer material and said second electrically conductive circuit forming an organic memory device adjacent said first part of said first electrically conductive circuit; wherein said thin, second layer of organic polymer material includes opposing ends, said substantially parallel lines of said second electrically conductive circuit further extending down the sides of said opposing ends of said thin, second layer of organic polymer material and onto said first layer of organic dielectric material; and
at least one electrical component positioned on said circuitized substrate of said electrical assembly and electrically coupled to said first electrically conductive circuit of said circuitized substrate.

20. The invention of claim 19 wherein said information handling system comprises a personal computer.

21. The invention of claim 19 wherein said information handling system comprises a mainframe computer.

22. The invention of claim 19 wherein said information handling system comprises a computer server.

* * * * *